United States Patent
Moeskops

(10) Patent No.: US 9,793,757 B2
(45) Date of Patent: Oct. 17, 2017

(54) REMOTE PROTECTION AND SWITCHING DEVICE FOR ELECTRICAL SYSTEMS

(71) Applicant: COCKERILL MAINTENANCE & INGENIERIE S.A., Seraing (BE)

(72) Inventor: Eric Moeskops, Tongres (BE)

(73) Assignee: CMI DEFENCE S.A., Loncin (BE)

( * ) Notice: Subject to any disclaimer, the term of this patent is extended or adjusted under 35 U.S.C. 154(b) by 71 days.

(21) Appl. No.: 14/910,263

(22) PCT Filed: Aug. 12, 2014

(86) PCT No.: PCT/EP2014/067252
§ 371 (c)(1),
(2) Date: Feb. 5, 2016

(87) PCT Pub. No.: WO2015/022329
PCT Pub. Date: Feb. 19, 2015

(65) Prior Publication Data
US 2016/0181866 A1    Jun. 23, 2016

(30) Foreign Application Priority Data

Aug. 14, 2013 (BE) .................................. 2013/0544

(51) Int. Cl.
*H02J 13/00* (2006.01)
*G05F 5/00* (2006.01)
(Continued)

(52) U.S. Cl.
CPC ........ *H02J 13/0003* (2013.01); *G01R 19/165* (2013.01); *G01R 19/16519* (2013.01);
(Continued)

(58) Field of Classification Search
None
See application file for complete search history.

(56) References Cited

U.S. PATENT DOCUMENTS 4,692,696 A * 9/1987 Bray ...................... G01R 35/00
324/202
5,903,422 A * 5/1999 Hosokawa ......... G01R 19/0092
327/427
(Continued)

FOREIGN PATENT DOCUMENTS

CH    EP 2669921 A1 * 12/2013 ........... H01H 33/596
CN      104218535 A * 12/2014
(Continued)

*Primary Examiner* — Steven Snyder
(74) *Attorney, Agent, or Firm* — Leydig, Voit & Mayer, Ltd.

(57) ABSTRACT

A remotely controlled electronic general switch in DC power electrical supply system(s), ensuring switching and control of current and supply voltage, has an electronic module. The module has a controller or processor connected (i) to the switching and measurement circuit, the controller and measurement circuit optionally being linked bidirectionally, the controller being configured such that, when it receives a voltage and current measurement of the measurement circuit, it is respectively able to verify whether the input voltage lies in a predetermined interval and to instruct current interruption by the switching circuit for a certain duration, as a function of the measured current value, and (ii) to the communication interface, the communication interface connected to the communication bus and controller optionally being linked bidirectionally, such that the controller can be programmed remotely. An addressing bus, connected to the controller, enables selection, from several systems, a particular supply system linked to the general switch.

10 Claims, 2 Drawing Sheets

(51) Int. Cl.
  *G06F 13/42* (2006.01)
  *H02H 3/38* (2006.01)
  *H02J 1/00* (2006.01)
  *H02H 1/00* (2006.01)
  *G01R 19/165* (2006.01)
  *H02H 3/087* (2006.01)
  *H02H 3/08* (2006.01)

(52) U.S. Cl.
  CPC ............ *G05F 5/00* (2013.01); *G06F 13/4282* (2013.01); *H02H 1/0007* (2013.01); *H02H 3/08* (2013.01); *H02H 3/087* (2013.01); *H02H 3/38* (2013.01); *H02J 1/00* (2013.01); *H02J 13/00* (2013.01)

(56) References Cited

U.S. PATENT DOCUMENTS

| | | | | |
|---|---|---|---|---|
| 7,672,099 B2 * | 3/2010 | Bax | ........................ | H02H 3/347 361/42 |
| 8,014,902 B2 * | 9/2011 | Kates | ....................... | E04H 4/129 4/490 |
| 8,716,887 B2 * | 5/2014 | Thomson | ................... | H02J 3/14 307/11 |
| 8,837,103 B2 * | 9/2014 | Weiher | .................... | H02H 3/093 361/96 |
| 8,879,226 B2 * | 11/2014 | Esumi | ................ | H03K 17/0822 361/93.1 |
| 8,995,103 B2 * | 3/2015 | Weiher | .................... | H02H 3/093 361/95 |
| RE46,219 E * | 11/2016 | Kates | ....................... | E04H 4/129 |
| 2006/0041655 A1 * | 2/2006 | Holloway | ................. | G06F 1/18 709/223 |
| 2006/0049694 A1 | 3/2006 | Kates | | |
| 2008/0100140 A1 * | 5/2008 | Sorenson | ............ | H02J 13/0062 307/40 |
| 2009/0086396 A1 * | 4/2009 | Bax | ........................ | H02H 3/347 361/93.6 |
| 2009/0225483 A1 | 9/2009 | Veroni | | |
| 2010/0033277 A1 | 2/2010 | Davis | | |
| 2012/0098517 A1 * | 4/2012 | Esumi | ................ | H03K 17/0822 323/311 |
| 2013/0113451 A1 | 5/2013 | Zhang et al. | | |
| 2014/0285200 A1 * | 9/2014 | Bailey | ................. | G01R 33/288 324/318 |
| 2016/0011244 A1 * | 1/2016 | Buck | ................ | G01R 19/16571 324/76.11 |

FOREIGN PATENT DOCUMENTS

| | | | | |
|---|---|---|---|---|
| DE | 102014219807 A1 * | 3/2016 | ................. | B60L 1/06 |
| FR | WO 2013045778 A1 * | 4/2013 | ........... | G01R 15/185 |
| KR | EP 3038079 A2 * | 6/2016 | ............. | H02H 3/087 |
| WO | 2008057386 A2 | 5/2008 | | |

\* cited by examiner

REMOTE PROTECTION AND SWITCHING DEVICE FOR ELECTRICAL SYSTEMS

CROSS-REFERENCE TO RELATED APPLICATIONS

This application is a U.S. national stage application under 35 U.S.C. §371 of International Application No. PCT/EP2014/067252, filed on Aug. 12, 2014, and claims benefit to Belgian Patent Application No. 2013/0544, filed on Aug. 14, 2013. The International Application was published in French on Feb. 19, 2015, as WO 2015/022329 A1 under PCT Article 21 (2).

FIELD

The present invention relates to the technical field of systems for controlling powers of electric supplies in armored vehicles.

BACKGROUND

It is recognized that there exists an increased need for protecting electrical and electronic systems present in the turret of an armored vehicle. Indeed, in these types of systems, the currents are established during microseconds while protection devices such as fuses, circuit breakers and/or electromechanical relays are only suitable for reaction times in the range of milliseconds.

Presently, a power distribution is used. Within this framework, the most enhanced systems, i.e. for example magneto-thermal switches or a combination thereof and of fuses, are slower to react since they cause a variable response of the current depending on the required reaction time.

Magneto-thermal switches have a time/overcurrent tripping curve which is an intrinsic characteristic of the component and is not programmable. One is then forced to set a maximum admissible value of the average current overtime, the system putting itself in a protection mode only if the instantaneous actual current exceeds this maximum value. As failure peaks have to be taken into account, this value should generally be quite high (for example a few tens of amperes). It ensures that one is forced to overdimension the cabling (more robust cabling, larger diameter), which entails more weight and stiffness for the latter and is therefore disadvantageous for the installation in a turret of an armored vehicle for example.

The solution for avoiding a variable current overtime is to abandon protection systems with electromechanical switches and to resort to an electronic protection without mechanical switch.

Electronic switches are known in the state of the art but the latter do not measure the current crossing them.

Document US 2013/113451 discloses a power conversion circuit comprising a voltage estimation circuit, a current estimation circuit and a pulse width modulation circuit. The voltage estimation circuit is configured for receiving an input voltage from an inductor of the power conversion circuit and for generating an estimation of an output voltage of the power conversion circuit on the basis of said voltage. The current estimation circuit is configured for receiving a current corresponding to a switch connected in series with the inductor and generating an estimation of an output current of the power conversion circuit on the basis of said current. The pulse width modulation circuit is configured for producing a pulse width modulated signal on the basis of estimation of the output voltage and of the estimation of the output current.

Document WO 2008/057386 discloses a system for remote management and monitoring of power in order to control an electrical apparatus powered by a power supply block. The system may comprise a structured circuit breaker casing for controlling and managing the power at the electrical apparatus via a centralized data bus and a centralized power bus. The circuit breaker casing may comprise at least a remotely actuated electronic circuit breaker (ECB) in the solid state which monitors and manages the power supply of the electrical apparatus and a switch connected to the ECB and capable of remotely circumventing the ECB. The system may also comprise a display and a controller which can remotely monitor and control the electrical apparatus by remotely actuating the ECB.

Document US 2006/0049694 discloses a load control system in an electrical power supply system, in which one or several load control devices are provided for controlling the power provided to the electrical equipment. An authority for managing the network remotely, such as a power company, a government body or a power transmission company, sends one or several commands to load control devices for adjusting the load on the electrical power supply system.

In one embodiment, said authority sends stopping commands. In one embodiment, the authority sends commands imposing low power mode operation to the electrical power supply device.

In one embodiment, the commands are time-limited, thus allowing the electrical power supply system to resume normal operation after a determined period of time.

In one embodiment, the commands comprise requests for having the control device report operating characteristics (for example, the yield, the operating time, etc.), back to said authority.

This application relates to the supply of alternating current through the electricity network for power applications in the residential or industrial field and uses electromechanical circuit breaker devices.

Document US 2009/0225483 discloses an electric circuit breaker device protecting an electric circuit against overload. A first remotely programmable device for triggering the circuit breaker receives an external command with a programmable current threshold, detects a current level in the electric circuit and is able to trigger an interruption in the electric circuit depending on the detected current level in relationship with a first current period associated with the programmable current threshold stored in memory. A second device for triggering the circuit breaker is laid out for triggering an interruption in the electric circuit according to a second period of current different of the first period, for example a shorter one, if a current circulating in the electric circuit exceeds a predetermined rated current during a period greater than the second period of the current. This technology, also intended for use on the electric distribution network, involves several triggering levels but reacts slowly considering the use of magneto-thermal circuit breakers.

SUMMARY

An aspect of the invention provides a remotely controlled electronic general switch in a DC electrical power supply system, for ensuring a switching function and a control function of a power supply current and voltage, the general switch comprising an electronic module comprising: a power input; a power output; an electronic circuit breaker or switching circuit, connected to the power input; a measurement circuit including a contactless current sensor and a voltage sensor, the measurement circuit being connected in series between the switching circuit and the power output; a communication interface connected to a bidirectional communications bus; a controller or processor connected to the switching circuit and to the measurement circuit, the controller being configured such that, when the controller receives an input voltage and a current measurement from the measurement circuit, the controller is respectively capable of verifying whether the input voltage is in a predetermined interval and of controlling a current interruption using the switching circuit during a certain period, depending on a value of the current measurement, and the controller being connected to the communication interface, the communication interface being connected to the bidirectional communications bus and the controller bidirectionally, such that the controller can be remotely programmed; and an addressing bus to which the controller is also connected, allowing selection, among several, of a particular power supply system connected to the general switch, wherein the controller and the measurement circuit are bidirectionally linked, and wherein the measurement circuit includes an additional winding which allows the controller to inject a test signal detectable using the current sensor and enables verification of proper sensor operation at each system ignition and/or determination of sensor accuracy.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
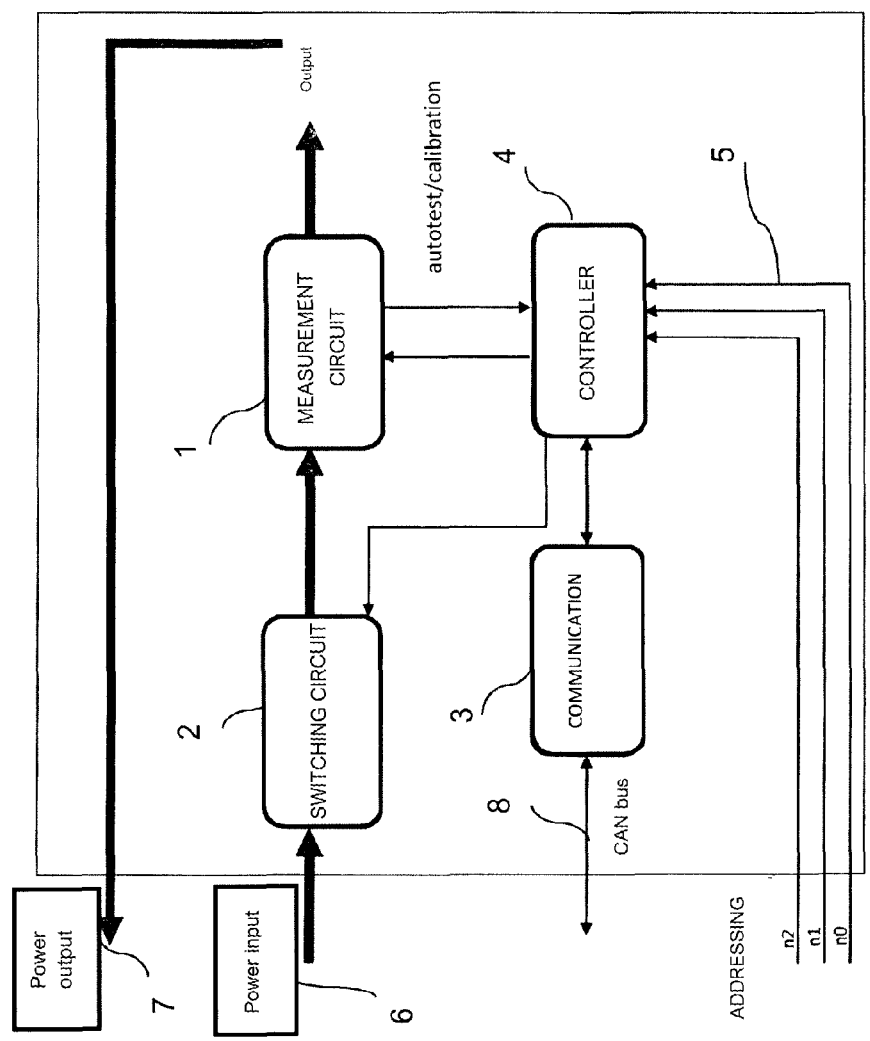
FIG. 1 illustrates the block diagram of the device for switching and protecting electrical systems according to the present invention.

A system according to aspects of the invention may be applied in any direct current (DC) electrical power supply system or any industrial electrical application using this type of power supply, at any location where electrical and/or electronic or cabling systems have to be protected.

An aim of the present invention is to propose a solution which gives the possibility of getting rid of the drawbacks of the protection systems with electromechanical switches and/or fuses.

The invention also aims at using a protection system which gives the possibility of changing the current protections over time so as to adjust the protection as close as possible to the actual consumption of the switch.

The invention further aims at improving the speed and the accuracy of the current interruption in case of an overload or a short-circuit.

A first aspect of the present invention relates to a remotely controlled electronic general switch in at least one DC electrical power supply system, for ensuring a switching function and a control function of the power supply current and voltage, composed of an electronic module comprising:
  a power input;
  a power output;
  an electronic circuit breaker or switching circuit, connected to the power input;
  a measurement circuit provided with a contactless current sensor and a voltage sensor, said measurement circuit being connected in series between the switching circuit and the power output;
  a communication interface connected to a bidirectional communications bus;
  a controller or processor connected to the switching circuit and to the measurement circuit on the one hand, the controller being configured so that, when it receives a voltage and current measurement from the measurement circuit, it is respectively capable of verifying whether the input voltage is in a predetermined interval and of controlling a current interruption by means of the switching circuit during a certain period, depending on the value of said current measurement, and connected to the communication interface on the other hand, the connection between the communication interface connected to the communications bus and the controller being bidirectional, so that the controller can be remotely programmed;
  an addressing bus to which the controller is also connected, giving the possibility of selecting, among several ones, a particular power supply system connected to the general switch,
wherein, in a further aspect, the switch is characterized in that the connection between the controller (4) and the measurement circuit (1) is bidirectional and in that the measurement circuit (1) comprises an additional winding which allows the controller (4) to inject a test signal detectable by the current sensor and giving the possibility of verifying proper operation of the sensor at each ignition of the system and/or of determining the accuracy of the sensor According to preferred embodiments of the invention, the aforementioned general switch further comprises one or a suitable combination of the following characteristics:
  the controller contains a specific microcode capable of managing the programmable/configurable and adjustable/calibratable operating parameters dynamically, i.e. before and during operation, over a predetermined range of values;
  the programmable/configurable and adjustable/calibratable parameters over a predetermined range of values respectively comprise a plurality of overcurrent thresholds and of interruption periods corresponding to these different thresholds as well as a range of output voltages of the switch and the accuracy of the current sensor;
  the circuit for measuring the current further comprises means cooperating with the controller for testing and self-calibrating the contactless current sensor;
  said means cooperating with the controller for testing and self-calibrating the contactless current sensor are able to be applied at each power up of the power supply system;
  the measurement circuit comprises at least two comparators connected in parallel on the current sensor, each associated with an overcurrent threshold value ($I_1$, $I_2$, $I_{ov}$, ...) as a reference input of the respective comparators and the output of which is utilized by the controller for controlling the current interruption by means of the switch during a certain period if the value of said current measurement is greater than at least one of said threshold values;
the communications bus is a multiplexed serial bus, preferably of the CAN type with a speed ranging up to 10 Mbits/s;
the electronic circuit breaker or switching circuit is of the transistorized type.

A second aspect of the present invention relates to the use of the general switch described above, for protecting an electrical application and/or cabling systems against overload or overcurrents.

The protection device according to the invention should have the following features:
the use of electronic transistors, i.e. static parts, not requiring any movement for letting through the current;
the use of a control by a communications <<bus>>;
the use of a contactless current measurement in order to avoid or minimize energy losses;
the use of a self-calibration system due to the fact that the current measurement is contactless: at each ignition, the system therefore calibrates itself;
the use of programmable operating parameters.

According to a preferred embodiment of the invention, the proposed system is based on a processor (logic controller) having connections, respectively with:
a sensor for measuring the current;
a system of transistor switches for letting through or stopping the current;
a high-speed bidirectional communication channel for communicating the operating parameters, for example a multiplexed serial bus of the CAN (for Controller Area Network) type presently available up to 10 Mbits/s;
a selection means in order to be able to address several power supply modules on the same bus.

FIG. 1 schematically illustrates one embodiment of the electric protection and switching system according to the invention.

The <<sensor>> circuit (sensor 1) comprises both an analog sensor which measures the current without contact, for example of the Hall effect type, and the elements required for calibrating and testing the operation of the sensor. It sends back the information acquired to the controller (controller 4) which decides at which instant it has to cut the current, and for how long, and sends the corresponding command to the switch or circuit breaking device (switching 2). It is advantageous to conduct a contactless current measurement in order to minimize the energy losses in the system. The sensor circuit 1 also comprises a voltage sensor (not shown).

The use of a bus system of the CAN type 8 is particularly advantageous because of the great rapidity of the latter as it does not use an external computer.

The switch 2 cuts the current or lets it through.

The addressing 5 has inputs which give the possibility of differentiating the different power supply modules by an instruction given at the start. The device of the invention thus allows a modular application. Contrary to the applications of the state of the art with magneto-thermal switches, or generally without transistors, where a specific switch has to be selected for protecting each power device such as an oven, a pump, a motor, etc. (see US 2006/0049694 for example), the same protection device can be used and then programmed for each particular power supply.

The controller (controller 4) contains a specific microcode which manages the operating parameters.

Figure 2:
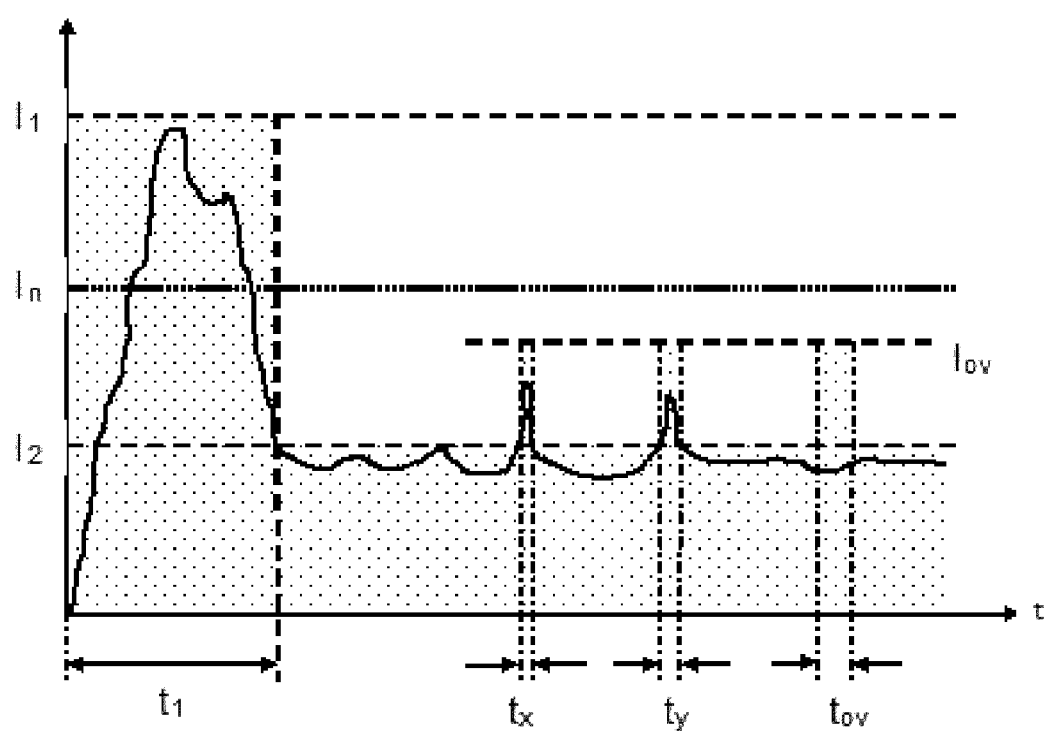
FIG. 2 illustrates an example of operation of the invention with different overcurrent threshold values programmed in the protection system.

An example of use of the protection device according to the invention is given hereafter with reference to FIG. 2. In this figure, maximum overcurrent values admissible in the system are defined: $I_1$ is the maximum admissible failure current (direct failure), $I_2$ is the admissible average failure current relative to the rated current and $I_{ov}$ is a temporarily admissible maximum overcurrent. The interruption period for the overcurrent of maximum value $I_1$ is $t_1$, $t_x$ and $t_y$ being examples of period of the allowed temporary overcurrents and $t_{ov}$ being the maximum admissible period of temporary overcurrent $I_{ov}$ ($t_x$, $t_y$, . . . <$t_{ov}$). The protection area (I, t) is illustrated in dotted lines. The protection device of the invention can be parameterized with values for $I_1$ (for example 120A), $I_2$ (for example 15A), $I_{ov}$, $t_1$, $t_{ov}$. The device according to the invention therefore gives the possibility of ensuring protection by tracking as closely as possible the actual consumption of the switch. In the state of the art, on the other hand, this fine adjustment is not possible as discussed above.

The taking into account by the system of several overcurrent threshold levels, such as in the example above, can be achieved as follows, still according to the invention. The analog signal provided by the current sensor is inputted into at least two comparators in parallel, each comparator having as a reference value one of the aforementioned overcurrent values ($I_1$, $I_2$, $I_{ov}$, . . . ). The outputs of the comparators are connected to the controller 4 which contains the sequence of instructions to be carried out if one of the thresholds is exceeded ($I_1$, $I_2$, $I_{ov}$, . . . ).

Moreover, the current sensor used is of the analog type and its accuracy will vary over time or with temperature. The sensor circuit 1 consequently contains an additional winding which allows the controller 4 to inject a test signal which will be detected by the current sensor and which will give the possibility of verifying proper operation of the sensor at each ignition of the system or of determining the accuracy of the sensor (calibration).

The invention has the following advantages:
this is a circuit breaker with programmable and adjustable parameters which gives the possibility of minimizing the risks and thus provides better protection for the electrical/electronic system and in particular for the cabling;
this is a static system not having any movement, or vibrations, which gives the capability of working in any environment;
the parameters are programmable/configurable and adjustable/calibratable dynamically, i.e. not only before use but also during use (one single model for a whole range);
a flexibility of the component with respect to the uses in terms of current range;
a much greater execution rapidity (the digital sampling being in the range of microseconds) than that of the magneto-thermal system (reaction in the range of milliseconds), which, in combination with the adjustment of the current level, gives the possibility of minimizing the diameter or the section of the cables as well as the dimensioning of the connectors;
a much more reliable measurement accuracy and robustness with respect to classical components.

The drawback is a greater consumption than a separate fuse and switch (but the value is minute).

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

LIST OF THE REFERENCE SYMBOLS

1 Sensor
2 Switching circuit
3 Communication
4 Controller
5 Addressing
6 Power IN
7 Power OUT
8 Multiplexed serial bus (CAN bus)

The invention claimed is:

1. A remotely controlled electronic general switch in a direct current (DC) electrical power supply system, for ensuring a switching function and a control function of a power supply current and voltage, the general switch comprising an electronic module comprising:
    a power input;
    a power output;
    an electronic circuit breaker or switching circuit, connected to the power input;
    a measurement circuit including a contactless current sensor and a voltage sensor, the measurement circuit being connected in series between the switching circuit and the power output;
    a communication interface connected to a bidirectional communications bus;
    a controller or processor connected to the switching circuit and to the measurement circuit, the controller being configured such that, when the controller receives an input voltage and a current measurement from the measurement circuit, the controller is respectively capable of verifying whether the input voltage is in a predetermined interval and of controlling a current interruption using the switching circuit during a certain period, depending on a value of the current measurement, and the controller being connected to the communication interface, the communication interface being connected to the bidirectional communications bus and the controller bidirectionally, such that the controller can be remotely programmed; and
    an addressing bus to which the controller is also connected, allowing selection, among several, of a particular power supply system connected to the general switch,
    wherein the controller and the measurement circuit are bidirectionally linked, and
    wherein the measurement circuit includes a winding which allows the controller to inject a test signal detectable using the current sensor and enables verification of proper sensor operation at each system ignition and/or determination of sensor accuracy.

2. The general switch of claim 1, wherein the controller includes a specific microcode able to manage programmable/configurable and adjustable/calibratable operating parameters dynamically, before and during operation, over a predetermined range of values.

3. The general switch of claim 2, wherein the programmable/configurable and adjustable/calibratable parameters over a predetermined range of values respectively include a plurality of overcurrent thresholds and interruption periods corresponding to different thresholds and a range of output voltages of the switch and the accuracy of the current sensor.

4. The general switch of claim 1, wherein the measuring circuit further includes a cooperating unit, cooperating with the controller, configured to test, and self-calibrate a contactless current sensor.

5. The general switch of claim 4, wherein the cooperating unit is configured to apply the test and self-calibration at each power up of the power supply system.

6. The general switch of claim 1, wherein the measurement circuit includes at least two comparators connected in parallel on the current sensor, each of the at least two comparators being associated with an overcurrent threshold value as a reference input, and
    wherein an output of the at least two comparators is utilized by the controller to control current interruption using the switching circuit during a certain period based on a current measurement value being greater than at least one of the overcurrent threshold values.

7. The general switch of claim 1, wherein the bidirectional communications bus is a multiplexed serial bus.

8. The general switch of claim 1, wherein the electronic circuit breaker or switching circuit is of the transistorized type.

9. A method comprising protecting an electrical direct current (DC) current application and/or a cabling system against an overload or overcurrent
    using the general switch of claim 1.

10. The general switch of claim 1, wherein the bidirectional communications bus is a Controller Area Network (CAN)-type multiplexed serial bus with a speed ranging up to 10 Mbits/s.

* * * * *